(12) United States Patent
Raschke et al.

(10) Patent No.: US 11,211,274 B2
(45) Date of Patent: Dec. 28, 2021

(54) LATCHING MECHANISM FOR A SUBSTRATE CONTAINER

(71) Applicant: ENTEGRIS, Inc., Billerica, MA (US)

(72) Inventors: Russ V. Raschke, Chanhassen, MN (US); Jason Steffens, Shakopee, MN (US)

(73) Assignee: ENTEGRIS, INC., Billerica, MA (US)

( * ) Notice: Subject to any disclaimer, the term of this patent is extended or adjusted under 35 U.S.C. 154(b) by 177 days.

(21) Appl. No.: 16/095,863

(22) PCT Filed: May 26, 2017

(86) PCT No.: PCT/US2017/034609
§ 371 (c)(1),
(2) Date: Oct. 23, 2018

(87) PCT Pub. No.: WO2017/205708
PCT Pub. Date: Nov. 30, 2017

(65) Prior Publication Data
US 2020/0211877 A1 Jul. 2, 2020

Related U.S. Application Data

(60) Provisional application No. 62/341,996, filed on May 26, 2016.

(51) Int. Cl.
*H01L 21/673* (2006.01)

(52) U.S. Cl.
CPC .. *H01L 21/67373* (2013.01); *H01L 21/67379* (2013.01); *H01L 21/67383* (2013.01)

(58) Field of Classification Search
CPC .................................................... B65D 85/48
(Continued)

(56) References Cited

U.S. PATENT DOCUMENTS 5,482,161 A * 1/1996 Williams .......... H01L 21/67373
206/711
5,931,512 A * 8/1999 Fan .......................... E05C 9/06
292/48

(Continued)

FOREIGN PATENT DOCUMENTS

JP  H11159218 A  6/1999
JP  41151152 A  5/2003
(Continued)

OTHER PUBLICATIONS

Entegris SB300 FOSB User Manual; 2013.

*Primary Examiner* — Robert Poon
(74) *Attorney, Agent, or Firm* — Entegris, Inc.

(57) ABSTRACT

A substrate container that utilizes a rocker linkage or a linear cam arrangement in latch mechanism that is actuated by a rotary cam. The rocker linkage or linear cam is mounted to an interior panel of a door of the substrate container and may be disposed proximate an edge portion of the interior panel. The rocker linkage or linear cam may be configured to exert an axial force component on a housing of the substrate container to seat the door against a seal member. The rocker linkage or linear cam also transfers the axial latching forces to the door to reduce transfer of forces to the cam. The rocker linkage or linear cam may be arranged to transfer axial forces in a radially outward direction when the latch mechanism is engaged, to prevent push back on the rotary cam.

10 Claims, 13 Drawing Sheets

(58) Field of Classification Search
USPC .......................................... 206/710–712, 832
See application file for complete search history.

(56) References Cited

U.S. PATENT DOCUMENTS

| | | | | |
|---|---|---|---|---|
| 5,957,292 | A * | 9/1999 | Mikkelsen | ........ H01L 21/67373 206/710 |
| 6,000,732 | A * | 12/1999 | Scheier | ............ H01L 21/67373 292/68 |
| 6,419,482 | B1 * | 7/2002 | Sakata | ............ H01L 21/67373 432/250 |
| 7,971,723 | B1 | 7/2011 | Chiu et al. | |
| 8,083,272 | B1 | 12/2011 | Wu et al. | |
| 2002/0027138 | A1 * | 3/2002 | Hyobu | ............... G11B 33/0433 220/230 |
| 2003/0140663 | A1 * | 7/2003 | Carson | ............. H01L 21/67386 70/63 |
| 2004/0040884 | A1 | 3/2004 | Pai et al. | |
| 2009/0026109 | A1 | 1/2009 | Hasegawa et al. | |
| 2009/0084785 | A1 * | 4/2009 | Nakatogawa | ..... H01L 21/67373 220/212.5 |
| 2013/0248400 | A1 * | 9/2013 | Ku | .................... H01L 21/67373 206/454 |
| 2014/0319020 | A1 | 10/2014 | Gregerson et al. | |
| 2016/0163575 | A1 * | 6/2016 | Phark | ................ H01L 21/67373 206/710 |

FOREIGN PATENT DOCUMENTS

| | | |
|---|---|---|
| JP | 2011091285 A | 5/2011 |
| KR | 1010088661 A | 5/2006 |
| TW | 201402423 A | 1/2014 |
| TW | 201404686 A | 2/2014 |
| TW | M500982 U | 5/2015 |
| TW | 201611169 A | 3/2016 |

* cited by examiner

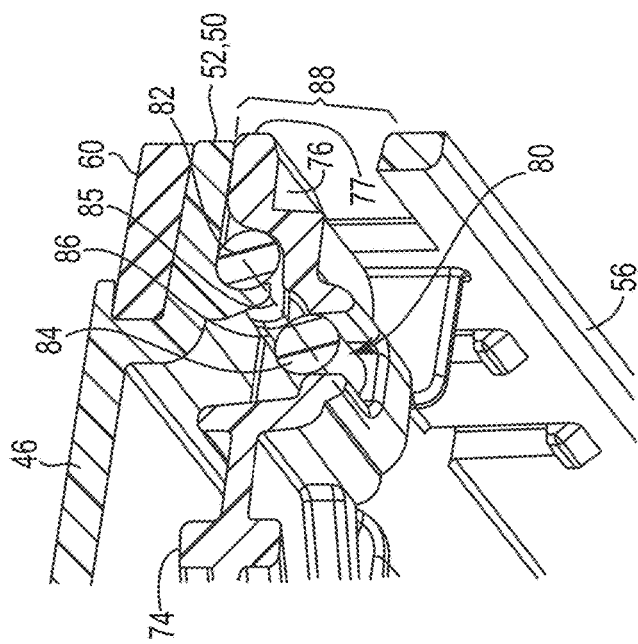

LATCHING MECHANISM FOR A SUBSTRATE CONTAINER

FIELD OF THE DISCLOSURE

This application is directed generally to substrate containers and more specifically to latching mechanisms for substrate containers.

BACKGROUND OF THE DISCLOSURE

Substrate containers, such as standard mechanical interface (SMIF) pods, front-opening shipping boxes (FOSBs), and front-opening unitary pods (FOUPs), often include a door mounted to a container or shell to provide closure of the container. The door is often equipped with a cam-actuated latching mechanism that actuates latches disposed in the door to engage a door frame on the container. A seal is disposed between the door and the container, typically mounted to either the door or the container, to provide isolation of the microenvironment that is defined within the closed container.

The seal provided by the seal members is subject to being breached, particularly during shipping and handling, and most particularly during an impact event (for example, when the substrate container is accidentally dropped or otherwise jarred). A substrate container that resists breaching of the seals during shipping and handling would be welcomed.

SUMMARY OF THE DISCLOSURE

A substrate container having a cam-actuated latch mechanism is disclosed that exerts a sealing force between a door and a housing of the substrate container while transferring forces away from the cam when the door is latched to the housing. Accordingly, breaches of the seal and accidental opening of the latch mechanism due to incidental forces incurred during shipping and handling are reduced.

The latch mechanism includes a rocker linkage that accomplishes the force transfer. The rocker linkage is mounted to an interior panel of a door of the substrate container and may be disposed proximate an edge portion of the interior panel. The rocker linkage is configured to exert an axial force component on a housing of the substrate container to seat the door against a seal member. The rocker linkage also transfers the axial latching forces, including axial forces on the door encountered during shipping and handling, to the door to reduce transfer of forces to the cam.

Structurally, a substrate container is disclosed according to various embodiments of the closure, including a housing with a frame that defines an opening about a central axis. A door is configured to mount within the opening of the door frame and includes an interior panel that cooperates with the housing when the door is mounted to the door frame to define an interior chamber of the substrate container, the interior panel defining a perimeter. A latch mechanism is housed within the door that includes a rotary cam rotatable about a cam axis, a latch plate including a cam follower and a latch tip, the cam follower being coupled to the rotary cam, a rocker linkage coupled to the latch plate proximate the latch tip, the rocker linkage including a first pivot coupled to the interior panel of the door and a second pivot coupled to the latch plate. The latch mechanism is extendible from a retracted configuration wherein the latch tip is radially inset from the door frame, to an extended configuration wherein the latch tip extends into the door frame. The rocker linkage rotates the latch tip in a first direction away from the interior panel that is parallel to the central axis and in a second direction that is radially outward from the cam axis to engage the latch tip with the door frame of the housing.

In some embodiments, the latch tip exerts an axial force on the frame of the housing that is parallel to the central axis to seat the door within the frame. In one embodiment, at least 80% of the force that is parallel to the central axis is transferred to the interior panel of the door via the rocker linkage. In some embodiments, at least 90% of the force that is parallel to the central axis is transferred to the interior panel of the door via the rocker link. In some embodiments, the rocker linkage defines a rocker axis that passes through a center of the first pivot and a center of the second pivot, the rocker axis being within 10 degrees of perpendicular to the door panel when the latch mechanism is in the extended configuration. The second pivot may be canted toward an edge portion of the interior panel with respect to the first pivot when the latch mechanism is in the extended configuration, the edge portion being a closest of a plurality of edge portions at the perimeter of the interior panel. In some embodiments, the central axis of the door opening is substantially concentric with the cam axis. In some embodiments, the substrate container is a bottom opening pod, such as a reticle carrier. In some embodiments, the substrate container is a front-opening container.

BRIEF DESCRIPTION OF THE DRAWINGS

FIG. 3 is a bottom perspective, exploded view of a substrate container with a partial cutaway view of a latch mechanism according to an embodiment of the disclosure.

FIG. 4 is an enlarged view of the cutaway view of FIG. 3.

DETAILED DESCRIPTION OF THE DEPICTED EMBODIMENTS

Figure 1:
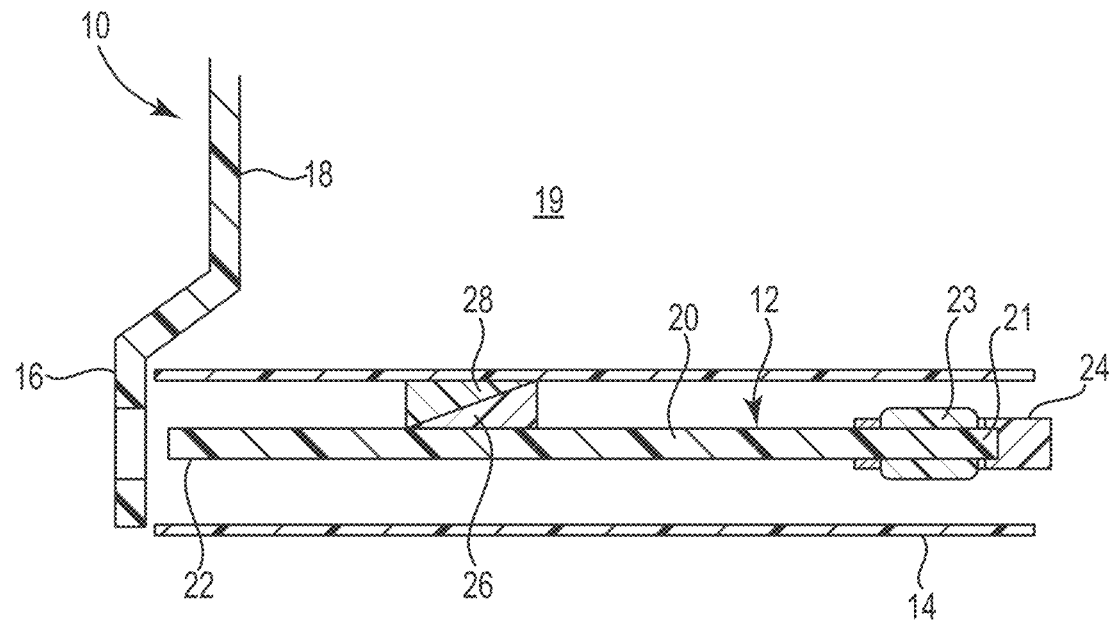
FIG. 1 is a sectional view of a conventional latch mechanism in a retracted configuration.
Figure 2:
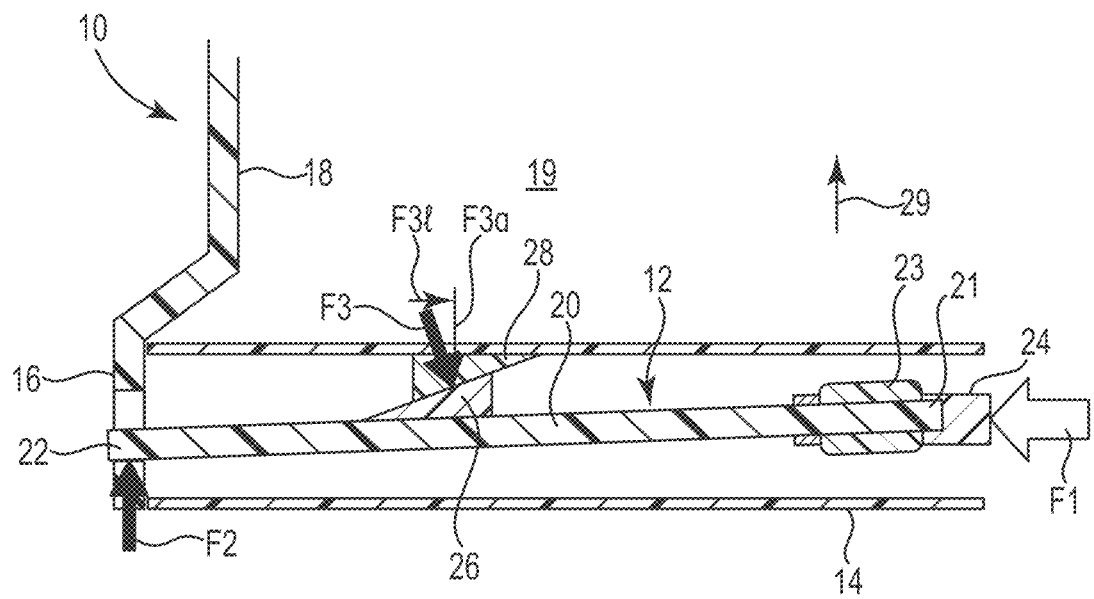
FIG. 2 is a sectional view of the conventional latch mechanism of FIG. 1 in an extended configuration.

Referring to FIGS. 1 and 2, a substrate container 10 utilizing a conventional latch mechanism 12 is depicted. The latch mechanism 12 is mounted within a door 14 that is disposed within a door frame 16 of a housing 18 to define an interior chamber 19 of the substrate container 10. The conventional latch mechanism 12 includes a latch arm 20 having a proximal end 21 and a distal end 22, a cam follower 23 coupled to the proximal end 21 of the latch arm 20, and a rotary cam 24 that engages the cam follower 22 to actuate the latch arm 20. A sliding ramp deflector 26 is mounted to the latch arm 20 and engages a complementary sliding ramp deflector 28 that is mounted to the door 14.

The sliding ramp deflectors 26 and 28 are arranged so that, when the latch arm 20 is actuated from a retracted configuration (FIG. 1) to an extended configuration (FIG. 2), the distal end 22 of the latch arm 20 is deflected away from the interior chamber 19 to engage the door frame 16 of the housing 18. By this mechanism, the door 14 is motivated toward the interior chamber 19 to seat the door 14 within the door frame 16. Typically, the rotary cam 24 is maintained in the extended configuration by a passive clasping arrangement (not depicted), such as detents on the rotary cam 24 that engage stationary posts anchored to the door 14.

The primary forces working on the latch mechanism 12 are an actuation force F1 exerted on the cam follower 23 by the rotary cam 24, an axial force F2 that acts on the distal end 22 of the latch arm 20, and a ramp force F3 that acts normal to the interface between the sliding ramp deflectors 26 and 28. The ramp force F3 includes an axial component F3$a$ that is substantially normal to a seating direction 29 of the door 14, and a lateral component F3$l$ that acts perpendicular to the axial component F3$a$.

The lateral component F3$l$ of the ramp force F3 acts in a direction that is generally opposite the actuation force F1. Excessive ramp forces F3 can actually cause the latch mechanism 12 to reverse actuate. Such excessive ramp forces F3 may be encountered, for example, during an impact event that causes an impulse load in addition to the axial force F2. The additional impulse load causes the ramp load F3 and the attendant lateral component F3$l$ to momentarily spike. If large enough, the momentary spike in the lateral component F3$l$ can jar the rotary cam 24 loose from the clasping arrangement, thereby releasing the latch mechanism. Furthermore, the ramp axial component F3$a$ of the ramp force F3 also contributes to distortion of the door, which can adversely affect the sealing arrangement between the door 14 and the housing 18.

Various embodiments of the present disclosure prevent generation of the lateral component F3$l$ and attendant reverse actuation that such forces can cause. Also, the distortion caused by the axial component F3$a$ are also addressed. Such embodiments are described below.

Figure 5:
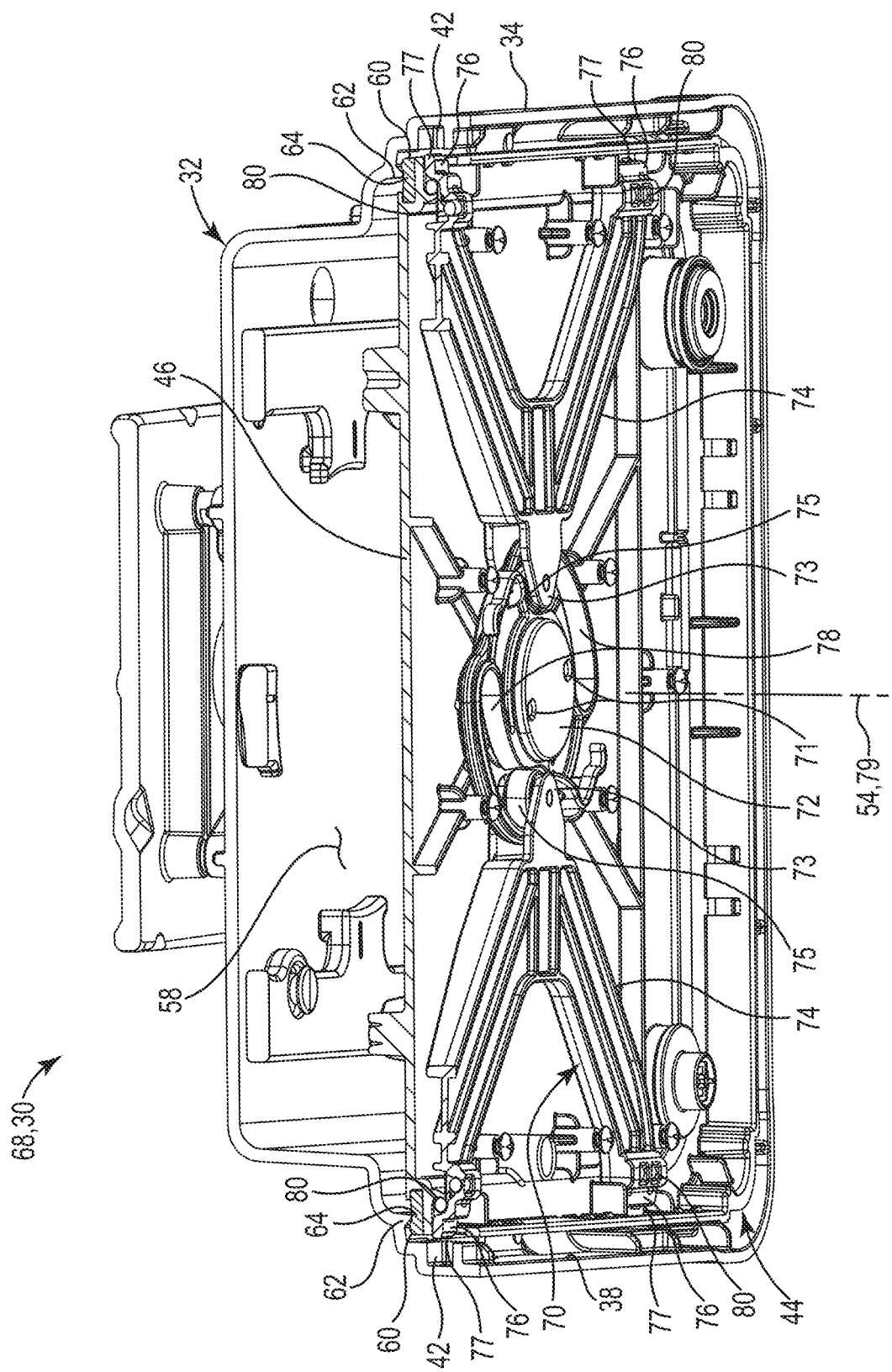
FIG. 5 is a bottom perspective, cross-sectional view of the substrate container of FIG. 3 with a latch mechanism in a retracted configuration and with an exterior door panel removed according to an embodiment of the disclosure.

Referring to FIGS. 3 through 5, a substrate container 30 is depicted in an embodiment of the disclosure. The substrate container 30 includes a housing 32 with a door frame 34 that defines an opening 36. The door frame 34 includes a perimeter portion 38 defining a plurality of sockets 42. A door 44 is configured to seat within the door frame 34. The door 44 includes an interior panel 46 and an exterior panel 48. The interior panel 46 includes edge portions 50 defines a continuous perimeter 52 about a central axis 54. In one embodiment, the interior and exterior panels 46 and 48 are separated by a perimeter wall 56 disposed at the perimeter 52 of the interior panel 46. The interior panel 46 cooperates with the housing 32 when the door 44 is mounted to the door frame 34 to define an interior chamber 58 (FIG. 5) of the substrate container 30. The door 44 may include a gasket or seal member 60 that engages with a seal ridge 62 (FIG. 5) that extends from the housing 32 to define a continuous seal line 64 for isolation of the interior chamber 58.

A latch mechanism 70 is housed within the door 44. As depicted in FIG. 5, the latch mechanism 70 includes a rotary cam 72 and a pair of latch plates 74. The rotary cam 72 is rotatable about a cam axis 79. The cam axis 79 may be concentric with the central axis 54, as depicted, but is not limited to this arrangement. In the depicted embodiment, the latch cam 72 defines mounting holes 71 (FIG. 5) for access with tooling pins (not depicted) for actuating the latch cam 72. Such tooling pins are common in various load port arrangements.

In the depicted embodiment, a cam follower 75 is disposed at a proximal end 73 of the respective latch plate 74, the cam follower 75 being coupled to cam slots 78 that are defined by the rotary cam 72. The cam follower 75 is a component or assembly that extends from the latch plate 74 and slides on the rotary cam 72 as the rotary cam 72 rotates to exert an actuation force on the latch plate 74. In some embodiments, the cam follower 75 includes a rotating component, such as a wheel and axle arrangement (depicted). In some embodiments, the cam follower 75 is non-rotating component that extends from the latch plate 74 to engage the rotary cam 72.

In the depicted embodiment, the latch plate 74 includes a pair of latch tips 76 disposed proximate the perimeter 52 of the interior panel 46, each latch tip 76 including a distal extremity 77. In the depicted embodiment, the latch tips 76 are unitary with the respective latch plate 74. The latch plate 74 can be any one of a variety of shapes, including a V-shaped portion (depicted), a U-shaped portion, or a rectangular plate, that stems from the cam follower 75 to support the pair of latch tips 76. In other embodiments, the latch plate is an arm that extends to a single latch tip 76, as depicted, for example, in FIG. 16.

A plurality of rocker linkages 80, one proximate each latch tip 76, are coupled to the latch plates 74 and the interior panel 46 of the door 44. In reference again to FIG. 4, each rocker linkage 80 includes a first pivot 82 and a second pivot 84 that are centered about a rocker axis 85 and separated by at least one standoff 86, the first pivot 82 being coupled to the interior panel 46, and the second pivot 84 being coupled to the latch plate 74. In the depicted embodiment, the rocker linkage 80 is mounted directly to the interior panel 46 and the latch plate 74. In other embodiments (not depicted), the coupling to the interior panel 46 and/or the latch plate 74 may be facilitated with an interim component, such as, but not limited to, a pivot yoke or other fastening arrangement.

Each of the latch tips 76 are aligned with a respective one of the plurality of sockets 42 of the door frame 34 (FIGS. 3 and 5), and may access the respective socket 42 via a respective through-slot 88 defined in the perimeter wall 56. In various embodiments, the first pivot 82 the rocker linkage 80 is coupled to the interior panel 46 at a location that is axially in line with a portion of the seal member 60.

The depicted substrate container 30 is a standard mechanical interface (SMIF) pod 68, and more particularly a reticle pod. The various latch mechanisms disclosed herein can be implemented in other types of substrate containers 30, such as front-opening unified pods (FOUPs) and front-opening shipping boxes (FOSBs) (see FIG. 16 below and attendant discussion).

Figure 6:
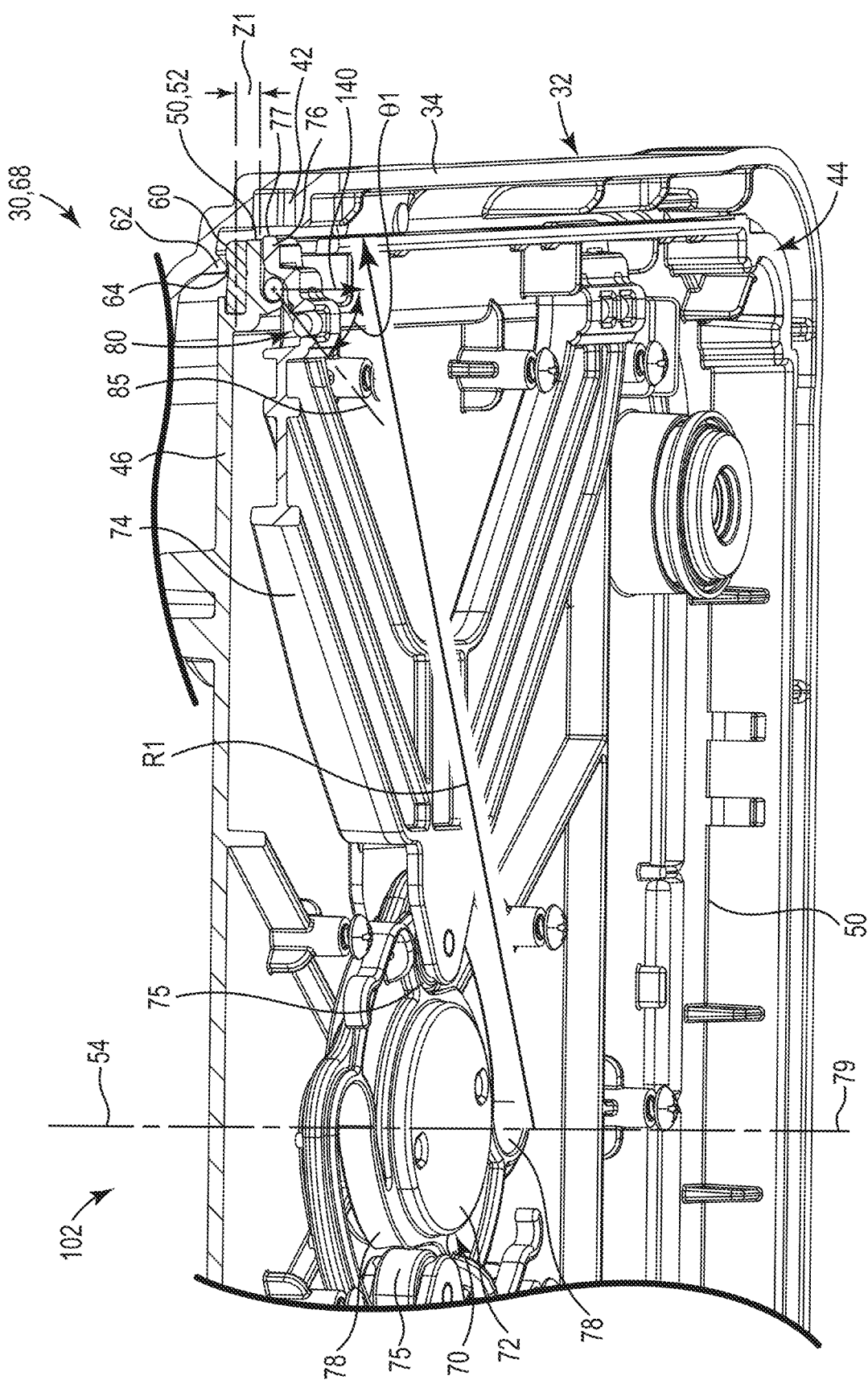
FIG. 6 is an enlarged, partial view of FIG. 5.
Figure 7:
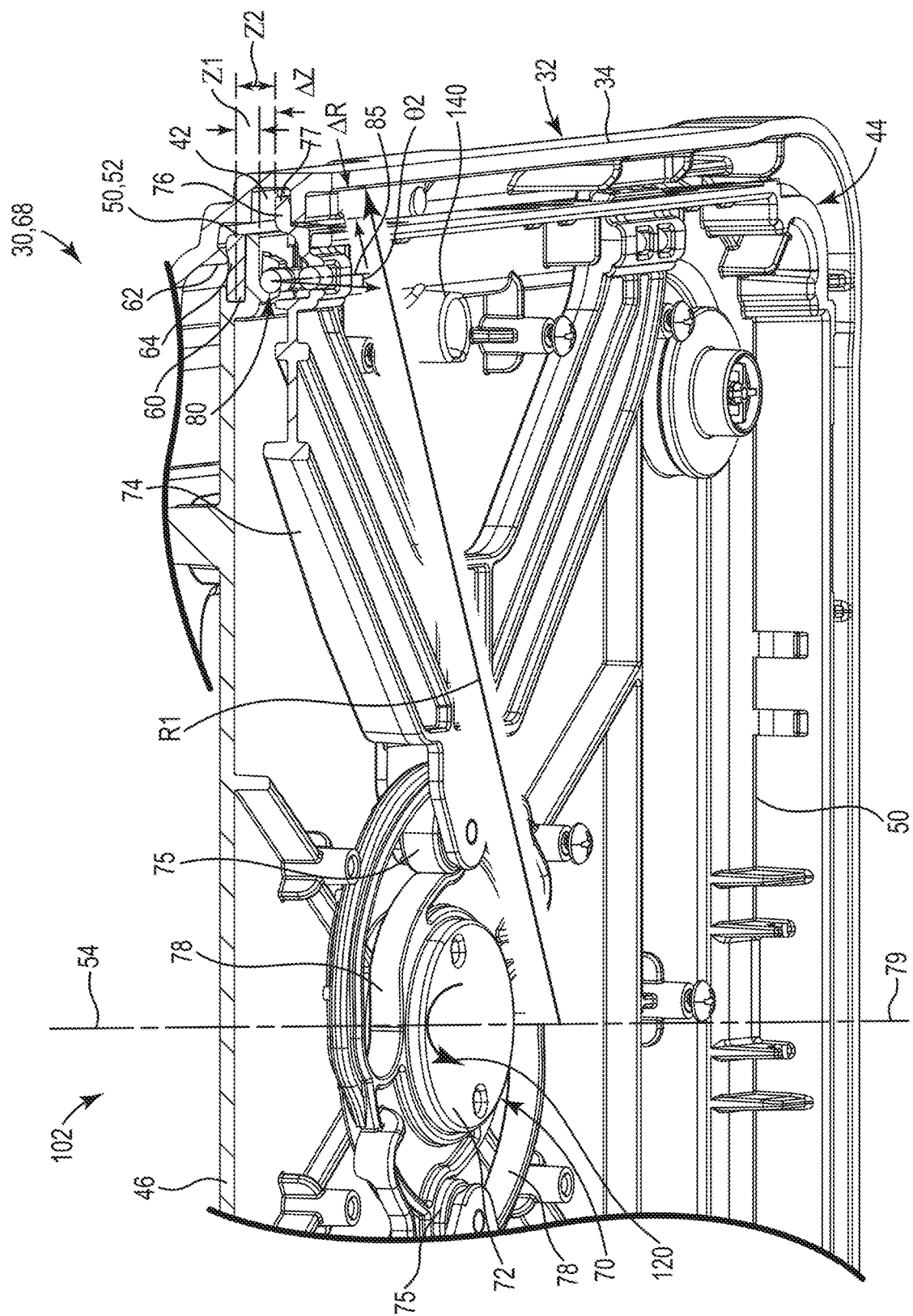
FIG. 7 is a partial, bottom perspective, cross-sectional view of the substrate container of FIG. 3 with the latch mechanism in an extended configuration and with an exterior door panel removed according to an embodiment of the disclosure.

Referring to FIGS. 6 and 7, the latch mechanism 70 is depicted in an unlatched or retracted configuration 102 and in a latched or extended configuration 104, respectively, according to embodiments of the disclosure. In the retracted configuration 102, the latch tips 76 are retracted inward to provide clearance between the latch tips 76 and the door frame 34 that enables the housing 32 and the door 44 to be axially translated relative to each other in directions parallel to the central axis 54. In the extended configuration, the latch tips 76 extend into the sockets 42 of the door frame 34 to restrict or eliminate the axial translation between the housing 34 and the door 44. Herein, an "axial translation" refers to a component of movement that is parallel to the central axis 54.

The latch plates 74 are actuated between the retracted configuration 102 and the extended configuration 104 by rotation of the rotary cam 72 about the cam axis 79. When the rotary cam 72 is rotated about the cam axis 79 in a first rotational direction 120 (FIG. 7), the cam slots 78 act against the cam followers 75 to push the latch plates 74 radially outward, away from the cam axis 79, causing the latch tips 76 to extend into the sockets 42 of the door frame 34. In this way, the latch mechanism 70 is actuated from the retracted configuration 102 (FIG. 6) to the extended configuration 104 (FIG. 7). When the rotary cam 72 is rotated about the cam axis 79 in a direction opposite the first rotational direction 120, the cam slots 78 act against the cam followers 75 to pull the latch plates 74 radially inward, towards the cam axis 79, causing the latch tips 76 to retract clear of the door frame 42, thereby actuating the latch mechanism 70 from the extended configuration 104 (FIG. 7) to the retracted configuration 102 (FIG. 6).

Figure 11:
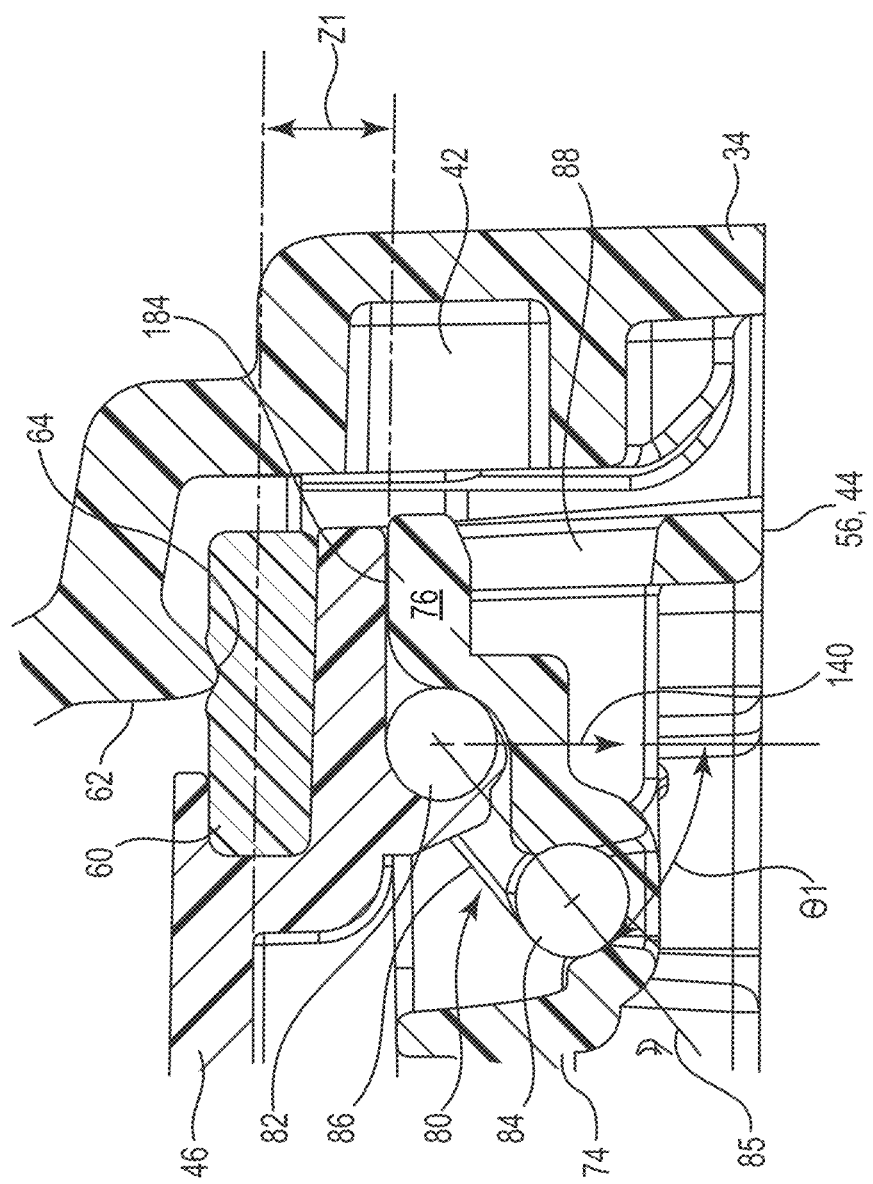
FIG. 11 is an enlarged, partial view of FIG. 10.

As depicted in FIG. 6, when in the retracted configuration 102, a radial dimension R1 is defined between the cam axis 79 and the distal extremity 77 of the latch tip 76. Also, an axial offset Z1 is defined between the interior panel 46 and the latch tip 76. In the depicted embodiment, the rocker axis 85 defines a retraction angle $\theta 1$ with respect to a normal vector 140 that is parallel to the central axis 54 and oriented away from the perimeter 52 of the interior panel 46. The axial offset Z1 and retraction angle $\theta 1$ are also depicted in the enlargement of FIG. 11.

In various embodiments, the retraction angle $\theta 1$ in the retracted configuration 102 is in a range of 30 degrees to 60 degrees inclusive. Herein, a range that is said to be "inclusive" includes the endpoint values of the stated range as well as the values between. In some embodiments, the retraction angle $\theta 1$ in the retracted configuration 102 is in a range of 40 degrees to 50 degrees inclusive. In some embodiments, the retraction angle $\theta 1$ in the retracted configuration 102 is in a range of 43 degrees to 47 degrees inclusive.

Figure 13:
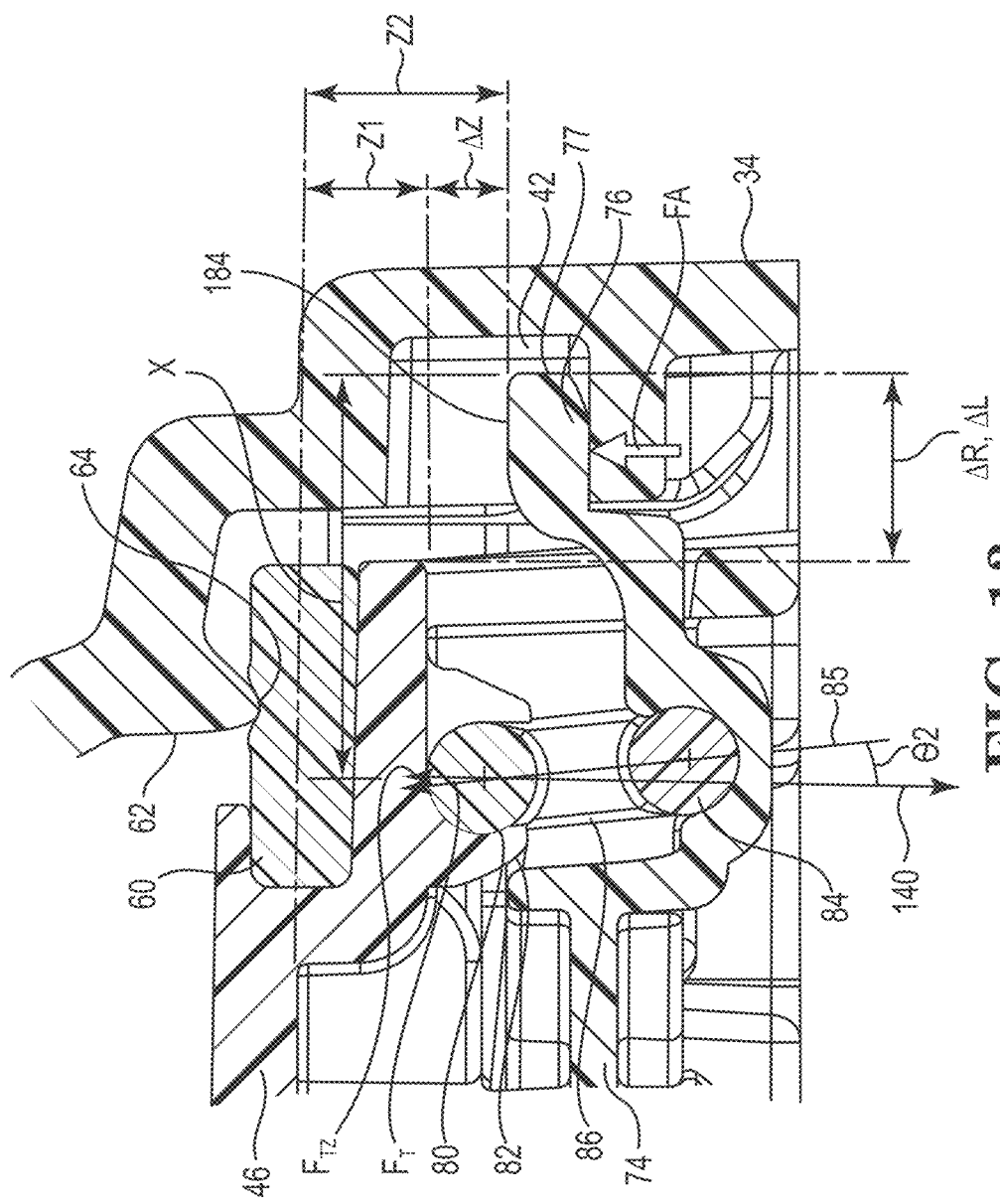
FIG. 13 is an enlarged, partial view of FIG. 12.

As depicted in FIG. 7, when in the extended configuration 104, a radial dimension R2 is defined between the cam axis 79 and the distal extremity 77 of the latch tip 76. The radial dimension R2 of the extended configuration 104 is greater than the radial dimension R1 of the retracted configuration 102, so that the latch tip 76 extends radially outward by a radial differential $\Delta R$. Also in the extended configuration 104, an axial offset Z2 is defined between the interior panel 46 and the latch tip 76. The axial offset Z2 of the extended configuration 104 is greater than the axial offset Z1 of the retracted configuration 102, so that the latch tip 76 extends axially away from the interior panel 46 by an axial differential $\Delta Z$ that is parallel to the central axis 54. The rocker axis 85 defines an extension angle $\theta 2$ with respect to the normal vector 140. The axial offsets Z1 and Z2, axial differential $\Delta Z$, and extension angle $\theta 2$ are also depicted in the enlargement of FIG. 13.

In the depicted embodiment, the extension angle $\theta 2$ is oriented toward the closest of the edge portions 50 of the interior panel 46, such that the second pivot 84 is canted or tilted away from the central axis 54. In other embodiments, the extension angle $\theta 2$ is substantially zero (i.e., the rocker axis 85 is substantially parallel to the cam axis 79, aligned with vector 140), or is oriented away from the closest of the edge portions 50 of the interior panel 46. In various embodiments, the extension angle $\theta 2$ in the extended configuration 104 is within 20 degrees (inclusive) of the normal vector 140. In some embodiments, the extension angle $\theta 2$ in the extended configuration 104 is within 15 degrees (inclusive) of the normal vector 140. In some embodiments, the extension angle $\theta 2$ in the extended configuration 104 is within 10 degrees (inclusive) of the normal vector 140. In some embodiments, the extension angle $\theta 2$ in the extended configuration 104 is in a range of −5 degrees to +10 degrees inclusive, where a negative angle is an angle that is oriented away from the edge portion 50 at the perimeter 52 that is closest to the rocker linkage 80, and a positive angle is an angle that is oriented toward the closest edge portion 50 of the interior panel 46. In some embodiments, the extension angle $\theta 2$ in the extended configuration 104 is in a range of 0 degrees to +10 degrees inclusive.

Figure 8:
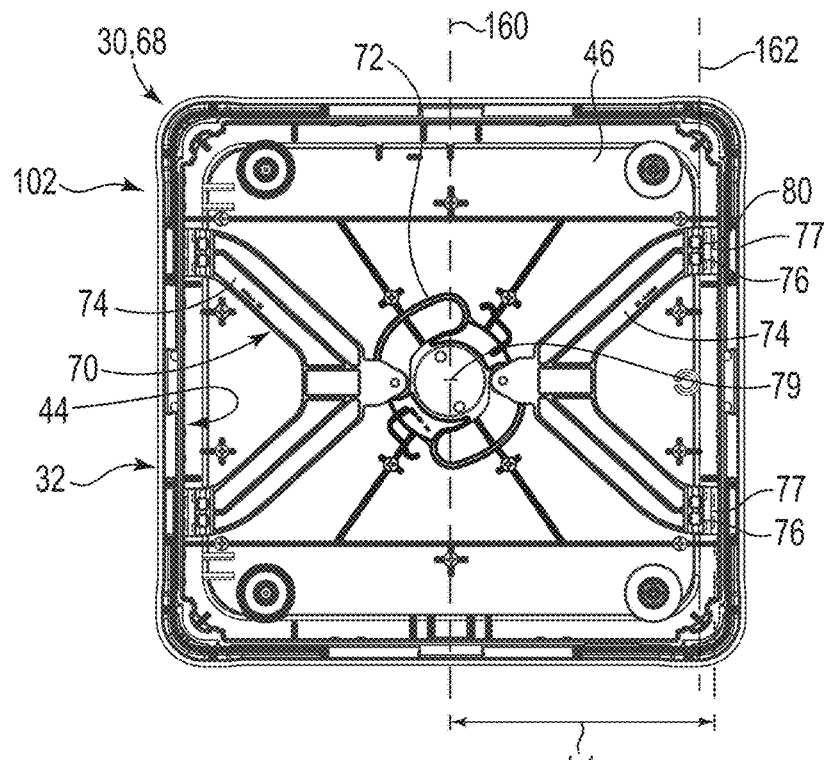
FIG. 8 is a bottom plan view of the substrate container of FIG. 3 with the latch mechanism in the retracted configuration and with an exterior door panel removed according to an embodiment of the disclosure.
Figure 9:
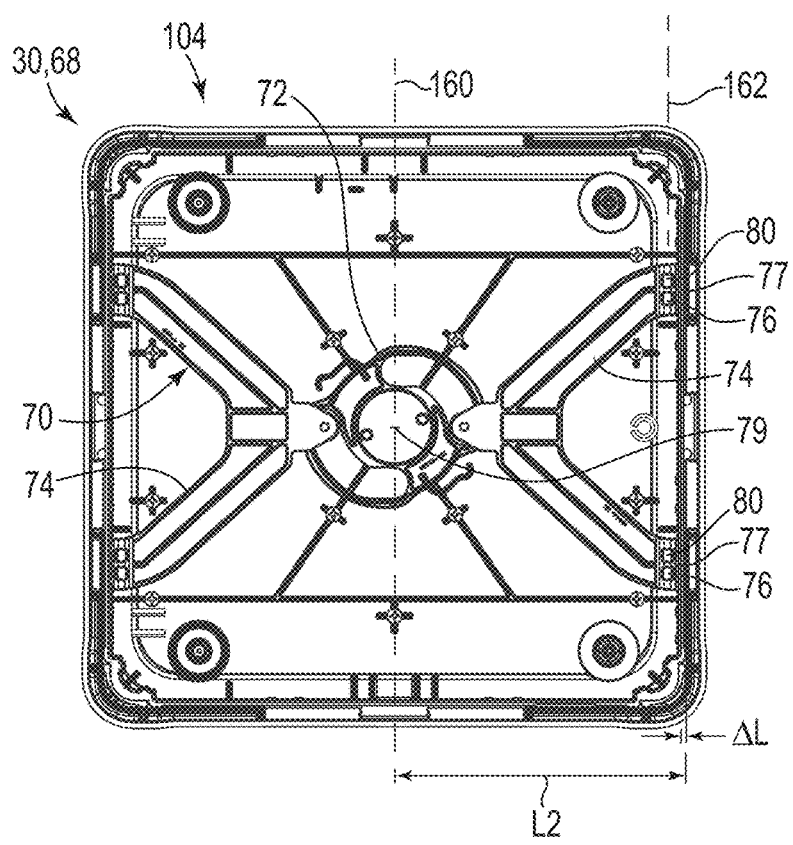
FIG. 9 is a bottom plan view of the substrate container of FIG. 3 with the latch mechanism in the extended configuration and with the exterior door panel removed according to an embodiment of the disclosure.

Referring to FIGS. 8 and 9, the latch mechanism 70 is depicted in the retracted and extended configurations 102 and 104, respectively, according to embodiments of the disclosure. In various embodiments, the rocker linkages 80 corresponding to the pair of latch tips 76 coupled to a given latch plate 74 define a datum line 162 that passes through both rocker linkages 80 coupled to the latch plate 74. The extension of the latch tips 76 can be characterized as being perpendicular to a mid-plane 160 defined by the cam axis 79 and which is parallel to the datum line 162. As depicted in FIG. 8, a lateral dimension L1 that is perpendicular to the mid-plane 160 is defined between the mid-plane 160 and the distal extremity 77 of the latch tip 76 when the latch mechanism 70 is in the retracted configuration 102. As depicted in FIG. 9, a lateral dimension L2 that is perpendicular to the mid-plane 160 is defined between the mid-plane 160 and the distal extremity 77 of the latch tip 76 when the latch mechanism 70 is in the extended configuration 104. The lateral dimension L2 of the extended configuration 104 is greater than the lateral dimension L1 of the retracted configuration 102, so that the latch tips 76 extend radially outward by a lateral differential $\Delta L$. The action of the rocker mechanisms 80 and latch tips 76 with respect to the axial offsets Z1 and Z2 and the axial differential $\Delta Z$, though not visible in FIGS. 8 and 9, are the same as described attendant to FIGS. 6 and 7.

Figure 10:
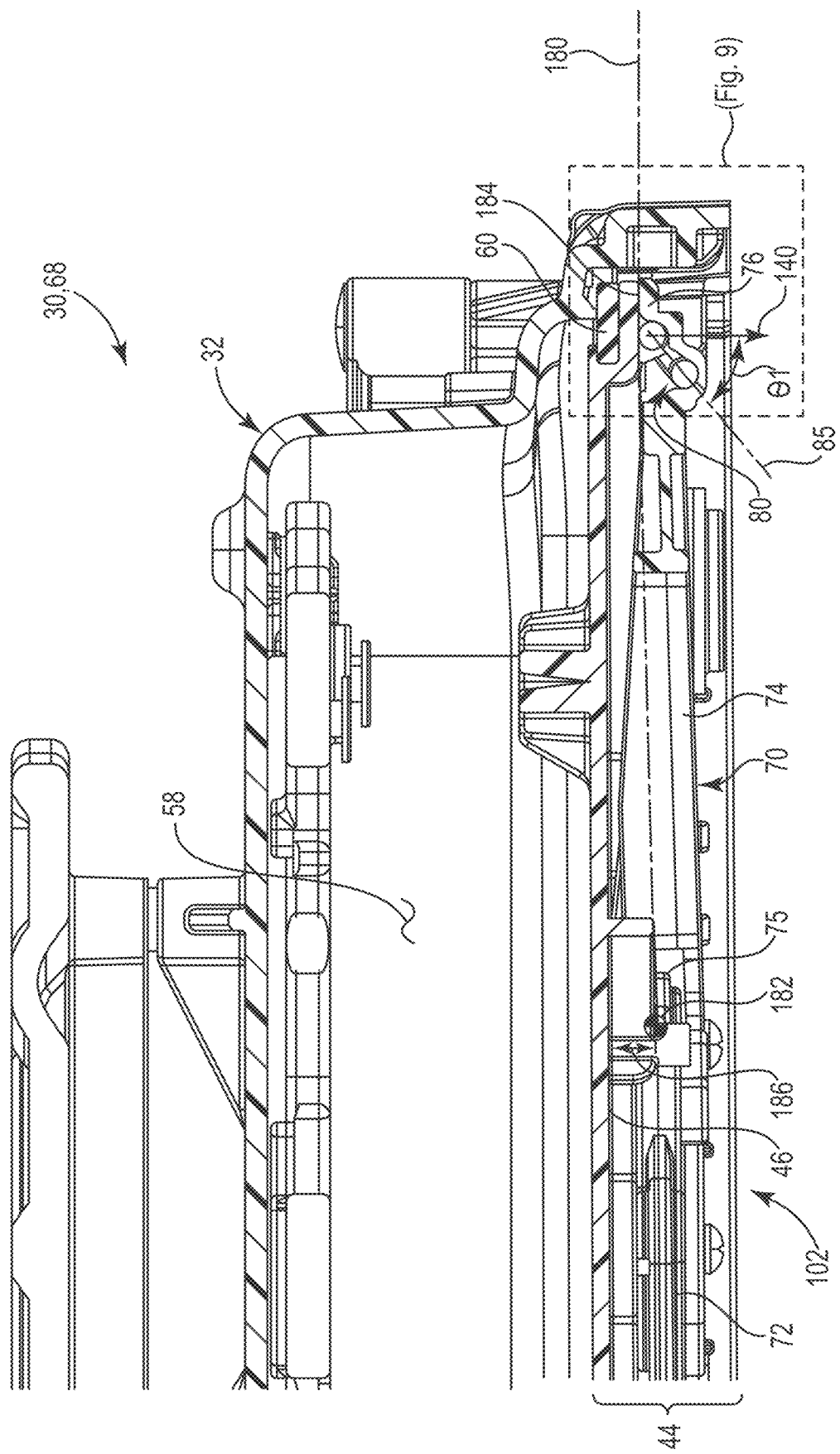
FIG. 10 is a partial, cross-sectional elevational view of the substrate container of FIG. 3 with the latch mechanism in the retracted configuration according to an embodiment of the disclosure.

Referring to FIGS. 10 through 13, the operation and effect of the rocker linkage 80 is further depicted according to embodiments of the disclosure. In the retracted configuration 102, the latch plate 74 extends along a retraction plane 180, as depicted in FIG. 10. For illustrative effect, the retraction plane 180 is defined as passing through a center point 182 of the respective cam follower 75 and being tangential to an axial extremity 184 of the latch tips 76 when the latch mechanism 70 is in the retracted configuration 102. An axial offset 186 is defined between the interior panel 46 and the center point 182 of the cam follower 75.

Figure 12:
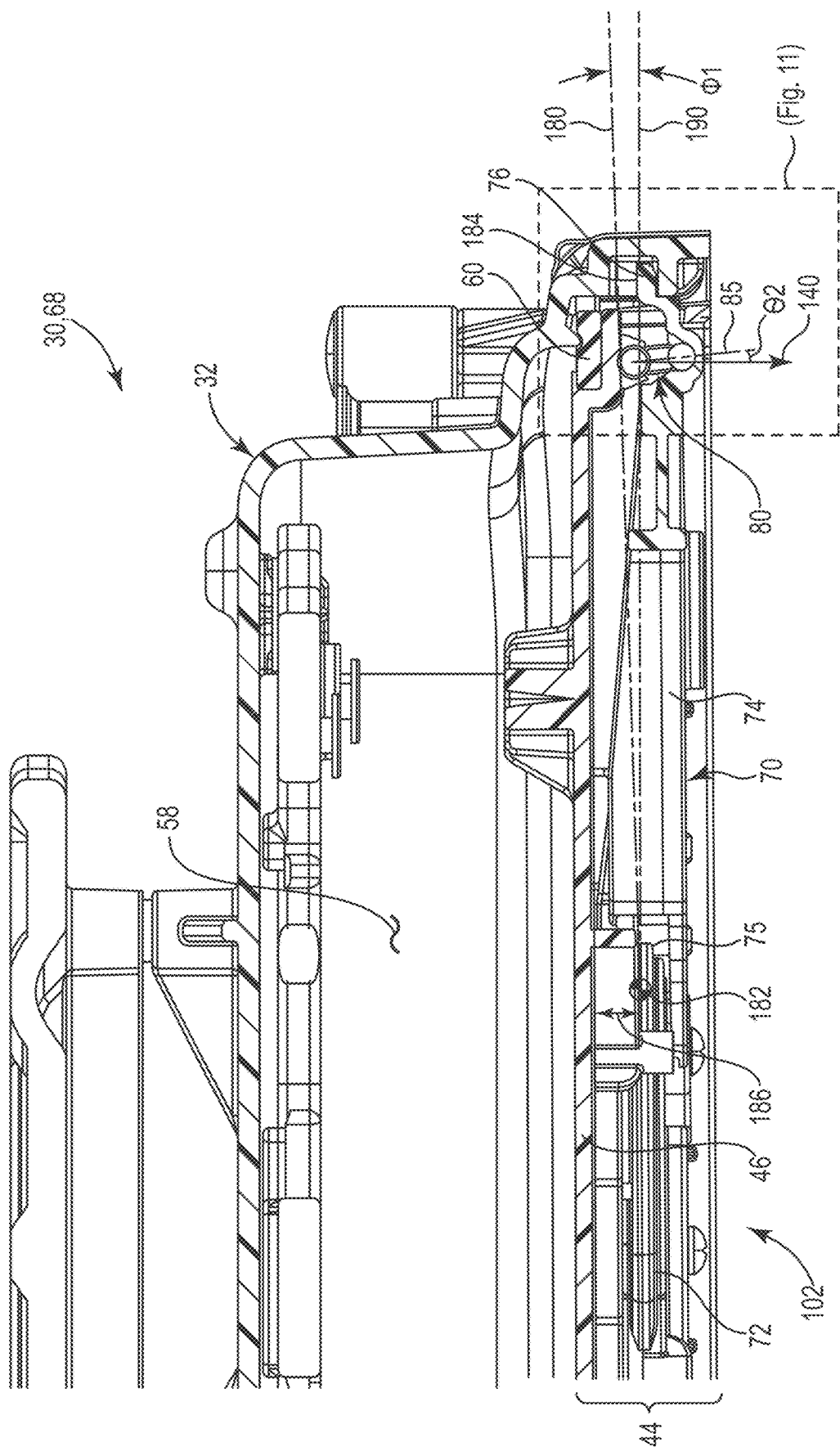
FIG. 12 is a partial, cross-sectional elevational view of the substrate container of FIG. 3 with the latch mechanism in the extended configuration according to an embodiment of the disclosure.

As the latch plate 74 is motivated radially or laterally outward from the retracted configuration 102 of FIGS. 10 and 11 to the extended configuration 104 of FIGS. 12 and 13, the rocker linkage 80 rotates about the first pivot 82 from the retraction angle θ1 to the extension angle θ2, causing the above-described differential changes ΔZ, ΔR, and/or ΔL between the axial offsets Z1 and Z2, the radial dimensions R1 and R2, and/or the lateral dimensions L1 and L2, respectively. The differential changes ΔZ, ΔR, and/or ΔL cause the latch tip 76 to swing away from the interior panel 46 and radially outward into engagement with the door frame 34. However, in some embodiments, the axial offset 186 of the center point 182 of the cam follower 75 remains substantially the same, whether in the retracted configuration 102 or the extended configuration 104. Accordingly, when in the extended configuration 102 and as depicted in FIG. 12, an extension plane 190 is defined that is rotationally offset by an angle φ from the retraction plane 180. The extension plane 190 is defined as passing through the center point 182 of the respective cam follower 75 and being tangential to the axial extremity 184 of the latch tips 76 when the latch mechanism 70 is in the extended configuration 104.

Functionally, the axial offset ΔZ causes the latch tips 76 engage the door frame 34 in the axial direction (i.e., parallel to the central axis 54), such that a reactionary axial force FA is exerted on the latch tip 76 by the door frame 34 (FIG. 13). A transferred portion of the reactionary axial force FA is transferred through the latch tip 76 and rocker linkage 80 to exert a transferred force FT that is transferred to the interior door panel 46. The transferred force FT includes an axial component FTz that is exerted axially on the interior door panel 46 to seat the door 44 within the door frame 34 (i.e., to push the door 44 towards the interior chamber 58). By this action, the seal member 60 is forced into contact with the seal ridge 62 of the housing 32 to positively set the continuous seal line 64. The rotation between the retraction plane 180 and the extension plane 190 may provide leverage for enhanced seating of the door 44 within the door frame 34.

The disposition of the rocker linkages 80 in axial alignment with portions of the seal member 60 provides an aligned transfer of force between the door 44 and the housing 32. The direct axial alignment and aligned transfer of force reduces or eliminates distortion of the door 44 (e.g., bending and/or twisting of the panels of the door) that would otherwise occur if the transferred force FTz was not in axial alignment with the portion of the seal member 60. Also, because of the disposition of the rocker linkages 80 at the radial location of the seal member 60, the rocker linkages 80 are located close to the door frame 34, so that a lateral distance X between the distal extremity 77 of the latch tips 64 and the second pivot 84 of the rocker linkage 80 is minimized or reduced (FIG. 13). The close proximity of the rocker linkages 80 to the latch tips 64 reduces the bending and flexing of the latch plates 74 that can otherwise cause breach or release of the seals.

Figure 14:
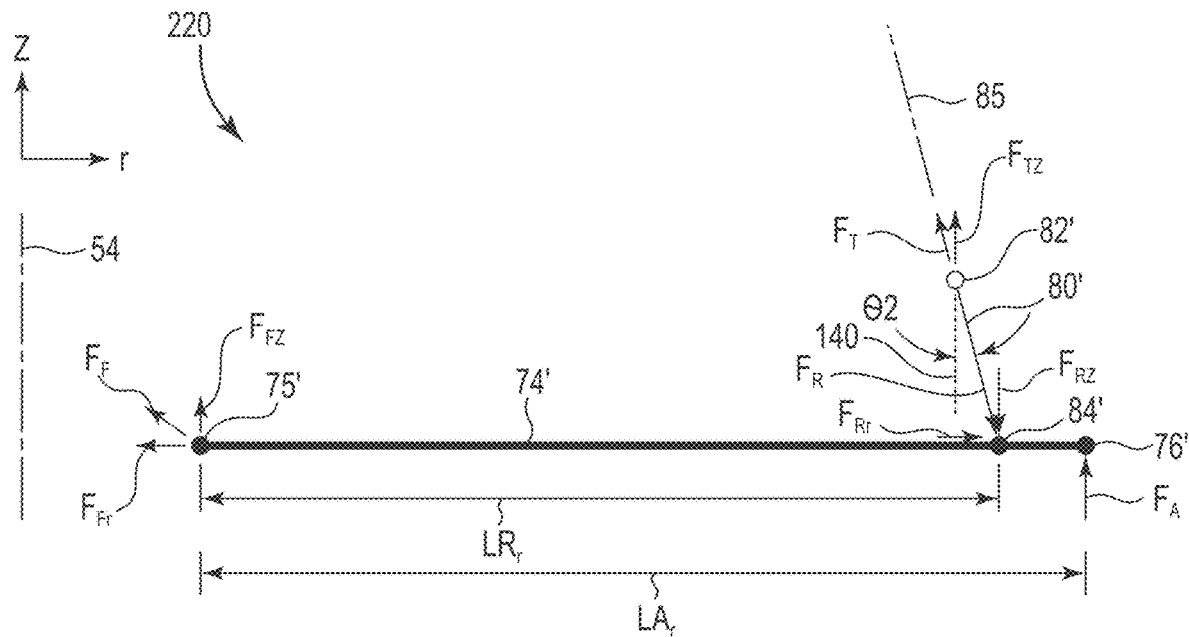
FIG. 14 is a free body diagram of a locking plate according to an embodiment of the disclosure.

Referring to FIG. 14, a simplified free body diagram 220 of the primary forces acting on the latch plate 74 (represented in the free body diagram by numerical reference 74') when in the extended configuration 104 is depicted according to an embodiment of the disclosure. The free body diagram 220 schematically represents the cam follower 75, the latch tip 76, the rocker linkage 80, and the first and second pivots 82 and 84 by numerical references 75', 76', 80', 82', and 84', respectively. The primary forces represented in the free body diagram 220 include the axial force FA acting at a representative point on the latch tip 76', a follower force FF acting on the cam follower 75', and a reactive force FR acting on the second pivot 84'. The reactive force FR includes an axial component FRz and a radial component FRr that are perpendicular to each other. Analysis of the free body diagram 220 assumes that the latch plate 74' is substantially perpendicular to the central axis 54 and that the axial force FA acts parallel to the central axis 54 (i.e., parallel to the z coordinate). The follower force FF includes an axial component FFz and a radial component FFr. An effective arm length LAr of the latch plate 74' is defined as radial length between the center of application of the follower force FF and the center of application of the axial force FA. An effective reactive length LRr is defined as the radial length between the center of application of the follower force FF and the center of application of the reactive force FR.

In equilibrium, the summation of the moments about the cam follower 75' is zero. That is:

$$FA \cdot LAr - FRz \cdot LRr = 0 \Rightarrow FRz = (LAr/LRr) \cdot FA \quad \text{Eq. (1)}$$

$$\text{where } FRz = FR \cdot \cos(\theta 2) \quad \text{Eq. (2)}$$

Also in equilibrium, the summation of forces in the radial direction is zero:

$$FFr - FRr = 0 \Rightarrow FFr = FRr \quad \text{Eq. (3)}$$

$$\text{where } FRr = FR \cdot \sin(\theta 2) \quad \text{Eq. (4)}$$

The summation of forces in the axial direction in equilibrium is also zero:

$$FA + FFz - FRz = 0 \Rightarrow FFz/FA = 1 - FRz/FA \quad \text{Eq. (5)}$$

Substituting Eq. (2) into Eq. (4) provides $$FRr = (FRz/\cos(\theta 2)) \cdot \sin(\theta 2) = FRz \cdot \tan(\theta 2) \quad \text{Eq. (6)}$$

Substituting Eq. (1) for FRz in Eq. (6), $$FFz = FA \cdot (LAr/LRr) \cdot \tan(\theta 2) \quad \text{Eq. (7)}$$

Also, by inspection, the transferred force FT transferred through the rocker linkage 80' is equal to (but in an opposite direction of) the reaction force FR, and the axial component FTz of the transferred force FT is equal to (but in an opposite direction of) the axial component FRz. That is:

$$FT = FR \quad \text{Eq. (8)}$$

$$FTz = FRz \quad \text{Eq. (9)}$$

From Eq. (7), for a given axial force FA, the radial component FFr of the follower force FF acting on the cam follower 75' is proportional to the ratio LAr/LRr and to the extension angle θ2. Furthermore, for the simplified free body diagram 220, the radial component FFr of the follower force FF will act equal and opposite to the radial component FRr of the reactive force FR. For extended angles θ2 that are canted away from the central axis 54, the radial component FRr is directed radially outward, so the radial component FFr of the follower force FF will act equally radially inward.

For an extension angle θ2 equal to zero (i.e., when the rocker axis 85 is substantially parallel to the central axis 54), the radial component FFr of the follower force FF is reduced to zero. Also, the greater the effective reactive length LRr, the less the radial component FFr of the follower force FF imparted to the cam follower 75' for non-zero extension angles θ2. Also, from Eq. (2), the corresponding axial component FRz of the reactive force FR is inversely proportional to the extension angle θ2.

Consider a latch mechanism 70 where the effective reactive length LRr is 90% of the effective arm length LAr (i.e., LAr/LRr=1/0.9=1.11), and the extended angle θ2 is 10 degrees. From Eq. (1), the axial component FRz of the reactive force FR is FRz=1.11·FA, or 111% of the axial force FA. Substituting into Eq. (2), FR=FRz/cos(θ2)=(1.11·FA)/cos(10)=1.13·FA. From Eq. (7), the ratio of the radial component to the axial force FFr/FA=1.11·tan(10)=0.196. Accordingly, in accordance with Eqs. (8) and (9), the transferred axial force FTz on the interior panel 46 is amplified by 11% relative to the axial force FA (and subsequent axial force applied to the seal member 60) and the total transferred force FT is amplified by 13% for the above-described example arrangement, while the follower force FF exerted on the cam is 0.196, or less than 20%, of the axial force FA exerted on the latch tip 76'. In accordance with Eq. (5), the axial component FFz of the follower force FF takes up the additional force due to the amplification of the axial component FRz of the reactive force FR. That is, FFz/FA=1−1.11=0.11, or the axial component FFz is 11% of the axial force FA. The calculation is repeated for various LRr/LAr ratios and for various extended angles θ2, and the results of the ratio of the follower force FF to the axial force FA is presented as a table and graph in the Appendix.

Accordingly, in various embodiments of the disclosure, the ratio of the effective reactive length LRr to the effective arm length LAr (LRr/LAr) is in a range from 0.6 to 1.0 inclusive. In some embodiments, the LRr/LAr ratio is in a range from 0.7 to 1.0 inclusive. In some embodiments, the LRr/LAr ratio is in a range from 0.8 to 1.0 inclusive. In some embodiments, the LRr/LAr ratio is in a range from 0.9 to 1.0 inclusive. In various embodiments, the ratio of the follower force FF exerted on the follower (and therefore on the cam) to the axial force FA is less than 50%. In some embodiments, the ratio FF/FA is less than 40%. In some embodiments, the ratio FF/FA is less than 30%. In some embodiments, the ratio FF/FA is less than 20%. In some embodiments, the ratio FF/FA is less than 10%.

Figure 15:
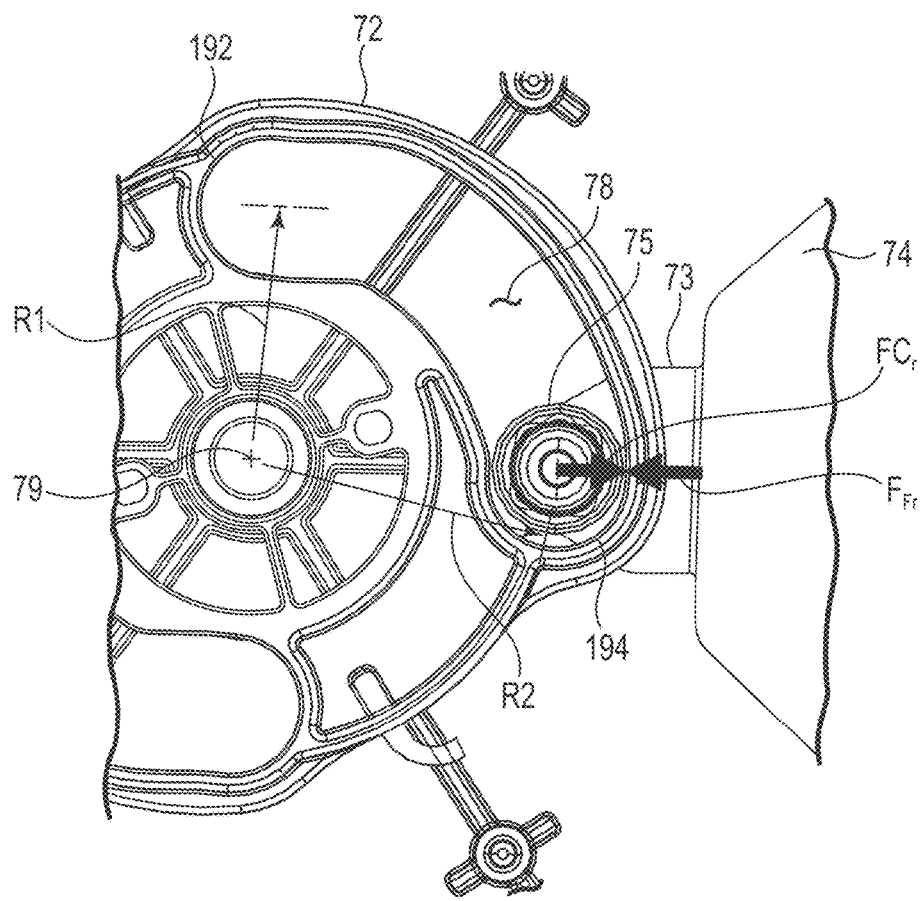
FIG. 15 is an enlarged, partial cutaway view of FIG. 9 according to an embodiment of the disclosure.

Referring to FIG. 15, a radial force FCr imparted to the rotary cam 72 by the latch plate 74 is depicted according to an embodiment of the disclosure. Each cam slot 78 of the rotary cam 72 defines a minimum slot radius RS1, defined between the cam axis 79 and the mid-radius of the cam slot 78 at a minimum radius end 192 of the cam slot 78. Each cam slot 78 of the rotary cam 72 also defines a maximum slot radius RS2, defined between the cam axis 79 and the mid-radius of the cam slot 78 at a maximum radius end 194 of the cam slot 78. When the latch mechanism 70 is in the extended configuration 104, the cam follower 75 is lodged at the maximum radius end 194 of the cam slot 78.

If, as calculated in the example above, the radial component FRr of the reactive force FR is directed radially outward, the radial component FFr exerts a radial inward force on the latch plate 74, and the latch plate 74 is in tension. Tension of the latch plate 74 causes the radial force FCr to act equally and opposite the radial component FFr, i.e., radially outward on the rotary cam 72. When the latch mechanism 70 is in the extended configuration, the outward direction of the radial force FCr effectively "pulls" on the rotary cam 72, further seating the cam follower 75 into the maximum radial end 194 of the cam slot 78. Accordingly, for extended angles θ2 that are canted away from the central axis 54, the rotary cam 72 is further secured by the axial force FA. Furthermore, additional axial forces applied to the latch tips 76, for example during an impact event), also act to further set the cam follower 75 into the maximum radial end 194. This effect of axial forces acting to further stabilize the cam follower 75 within the cam slot 78 is in contrast to conventional sliding ramp deflectors of the prior art. Conventional ramp deflectors transfer axial forces exerted on the latch tips to the cam as radially inward forces, as discussed above attendant to FIGS. 1 and 2.

Figure 16:
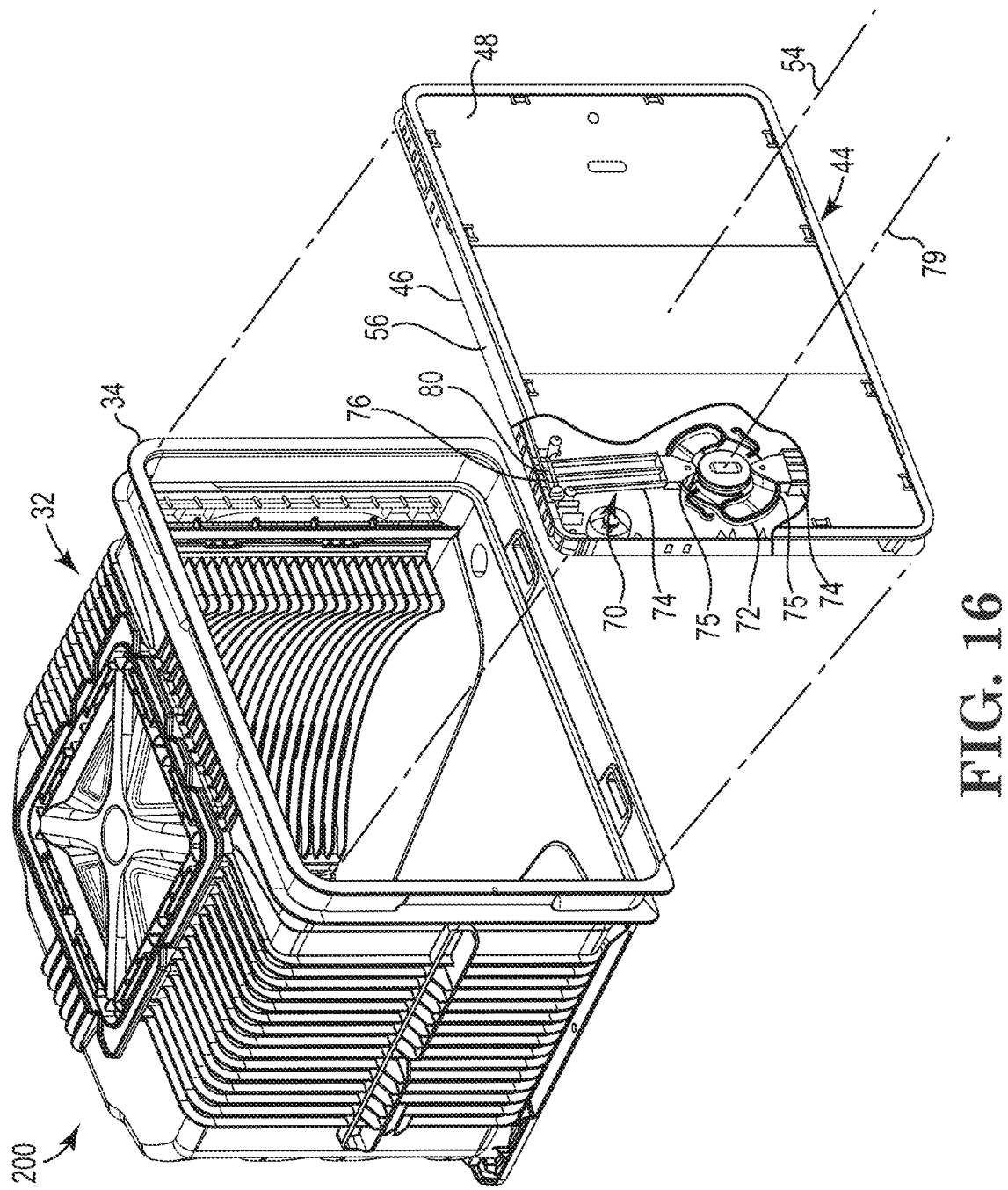
FIG. 16 is a perspective, cutaway view of a front opening unified pod (FOUP) utilizing a latching mechanism having a rocker linkage according to an embodiment of the disclosure.

Referring to FIG. 16, the latching mechanism 70 is depicted in use in a substrate container 32 that is a front opening unified pod 200 (FOUP) according to an embodiment of the disclosure. The FOUP 200 includes many of the same components and attributes as the SMIF pod, which are indicated with same-numbered numerical references. In the depicted embodiment, the latch mechanism 70 is one of two latch mechanisms used to secure the door to the door frame 34, and is accessed through a key hole slot 202. The rotating cam 75 defines a key hole 204 for actuation of the latching mechanism 70. Each latch plate 74 is a latch arm 206 having a single latch tip 76 and rocker linkage 80. Also, the cam axis 79 not concentric with the central axis 54 of the door 44. Accordingly, the latch mechanism 70 can be utilized in front opening substrate containers, such as the depicted FOUP or in a front opening shipping box (FOSB).

In various embodiments, the use of pivots 82 and 84 substantially reduce the amount of area that is in sliding contact as compared to ramps and/or guides that are implemented in many conventional door latch mechanisms. The reduced areas of sliding contact may also reduce particulate generation during actuation, a prevalent concern in the design of substrate carriers. Also, by limiting sliding contact to the rocker linkages 80, particulate generation can be further and more economically reduced by fabricating the rocker linkages 80 from preferred, low particulate-generating materials. Such materials include acetal, also known as polyacetal, polyoxymethylene (POM), or polyformaldehyde. While acetal is known to shrink during curing, it is suitable for small components, such as the rocker linkages 80. The latch arms 74, as well as the rotary cam 72, may be fabricated, for example, from a polycarbonate doped with polytetrafluoroethylene (PTFE), or other self-lubricating polymer.

Figure 17:
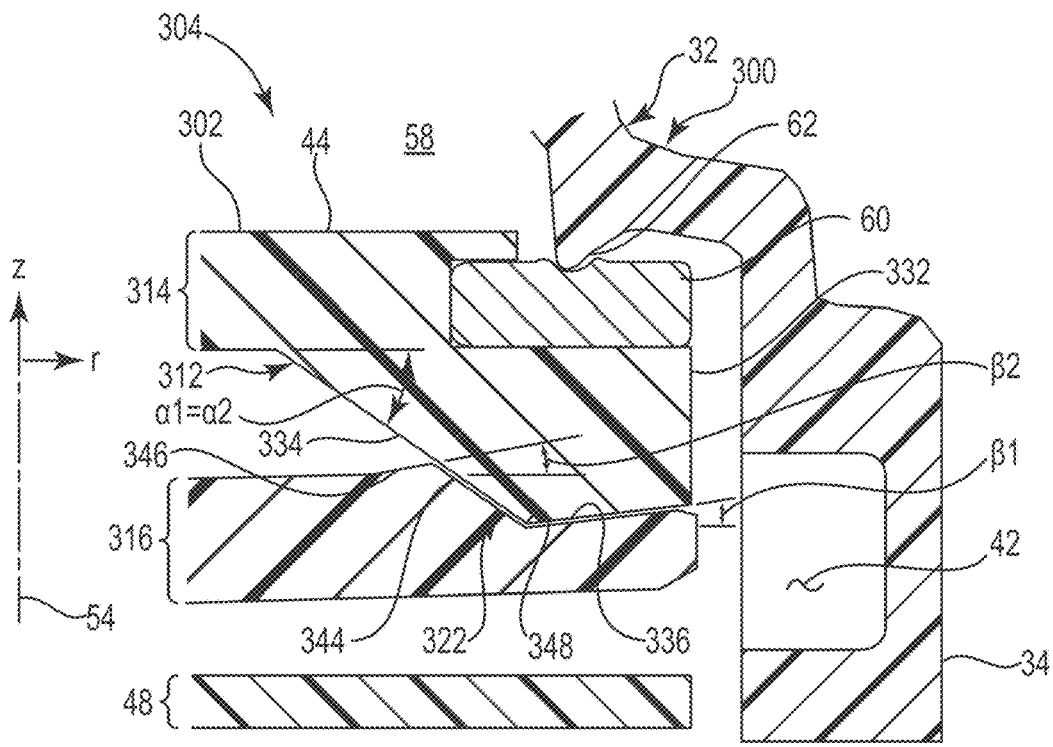
FIG. 17 an enlarged, partial cross-sectional elevational view of a latch tips with modified sliding ramp deflectors in a retracted configuration according to an embodiment of the disclosure.
Figure 18:
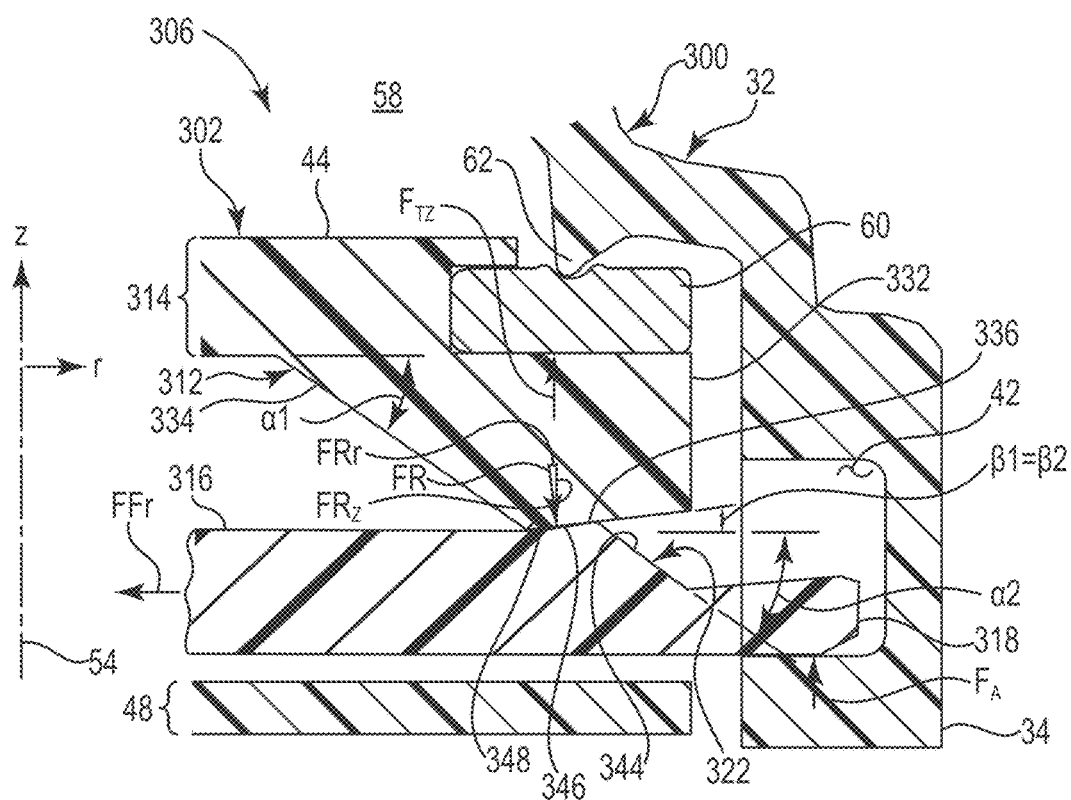
FIG. 18 is an enlarged, partial cross-sectional elevational view of the latch tips with modified sliding ramp deflectors of FIG. 17 in an extended configuration according to an embodiment of the disclosure.

Referring to FIGS. 17 and 18, a latch mechanism 302 utilizing modified sliding ramp deflectors in a substrate container 300 is depicted in a retracted configuration 304 and an extended configuration 306, respectively, according to embodiments of the disclosure. The substrate container 300 includes some of the same components and attributes as the substrate container 30, which are indicated with same-numbered numerical references. In the depicted embodiment, a linear cam structure 312 extends outward (i.e., away from the interior chamber 58) from an interior panel 314. A latch plate 316 includes a latch tip 318 and a linear follower structure 322 that is complementary to and contacts and is configured to slide on the linear cam structure 312.

In the depicted embodiment, the linear cam structure 312 is located proximate an edge portion 332 of the interior panel 314 and includes a ramp portion 334 defining a ramp slope α1 and a dwell portion 336 defining a dwell slope β1. In various embodiments, the dwell portion 336 of the linear cam structure 312 is substantially in axial alignment with the seal member 60 and the seal ridge 62 that extends from the housing 32. The linear follower structure 322 includes a ramp portion 344 defining a ramp slope α2 and a dwell portion 346 defining a dwell slope β2.

The ramp slopes α1 and α2 each slope away from the interior chamber 58 of the substrate container 300 in a radially outward direction. In some embodiments, the ramp slopes α1 and α2 define an angle when in the retracted configuration 304 that is in a range of 20 degrees to 45 degrees inclusive. In some embodiments, the ramp slopes α1 and α2 define an angle when in the retracted configuration 304 that is in a range of 25 degrees to 40 degrees inclusive. In some embodiments, the ramp slopes α1 and α2 define an angle when in the retracted configuration 304 that is in a range of 30 degrees to 40 degrees inclusive.

In the depicted embodiment, the dwell slopes β1 and β2 define a "reversed" angle relative to the ramp slopes α1 and α2, meaning that the dwell slopes α1 and α2 slope in a direction that is opposite the ramp slopes α1 and α2 with respect to the radial direction. As such, a peak 348 is defined at the junction of the latch tip 318. Such "reversed" angles of the dwell slopes β1 and β2 relative to the ramp slopes α1 and α2 are referred to herein by negative angle values.

Alternatively, the dwell slopes β1 and β2 may define a zero angle or a "non-reversed" angle (not depicted), meaning that the dwell slopes β1 and β2 slope in a direction that is the same as the ramp slopes α1 and α2 with respect to the radial direction. As such, no "peak" is defined, but merely an inflection point (not depicted). Such "non-reversed" angles of the dwell slopes β1 and β2 relative to the ramp slopes α1 and α2 are referred to herein by positive angles values.

Accordingly, in various embodiments, the dwell slopes β1 and β2 define an angle when in the extended configuration 306 that is in a range of −15 degrees to +15 degrees (inclusive) of the radial direction. In some embodiments, the dwell slopes β1 and β2 in the extended configuration 306 in a range of −10 degrees to +10 degrees (inclusive) of the radial direction In some embodiments, the dwell slopes β1 and β2 in the extended configuration 306 in a range of −15 degrees to +5 degrees (inclusive) of the radial direction. In some embodiments, the dwell slopes β1 and β2 in the extended configuration 306 in a range of −15 degrees to +0 degrees (inclusive) of the radial direction. In some embodiments, the dwell slopes β1 and β2 in the extended configuration 306 in a range of −10 degrees to +0 degrees (inclusive) of the radial direction.

The ramp portions 334 and 344 are positioned and configured to engage each other when in the retracted configuration 304. In the depicted embodiment, the ramp slopes α1 and α2 of the respective ramp portions 334 and 344 define the same numerical value when in the retracted configuration 304. Also in the depicted embodiment, the dwell slopes β1 and β2 define the same angle when in the extended configuration 306.

In operation, the latch plate 316 may be advanced from the retracted configuration 304 to the extended configuration 306 in the same way as the latch plate 74 of the substrate container 30 (e.g., by rotation of the rotary cam 72 so that the cam slots 78 act against the cam followers 75 to push the latch plates 74 (316) radially outward, as described attendant to FIG. 7). The ramp portion 334 of the linear cam structure 312 acts as a guide for the ramp portion 344 of linear follower structure 322 to deflect the latch tip 318 into the socket 42 and away from the interior panel 314 to engage the door frame 34. As the latch tip 318 approaches engagement with the door frame 34, the dwell portion 346 of the linear follower structure 322 passes over the peak 348 (or, in the case of a "non-reversed" angle for the dwell slopes β1 and β2, passes over the inflection) at the junction of the latch tip 318, the dwell portion 346 of the linear follower structure 322 slides onto the dwell portion 336 of the linear cam structure 312. In the fully extended configuration 306, the latch tip 318 is in contact with the door frame 34, and the dwell portion 346 of the linear follower structure 322 is seated on the dwell portion 336 of the linear cam structure 312, as depicted in FIG. 18.

In the fully extended configuration 306, the forces acting on the latch plate 316 include those described in the simplified free body diagram 220 of FIG. 14. The axial force FA, reactive force FR (including axial and radial components FRz and FRr), and the axial component FFz of the follower force FF are reproduced in FIG. 18. The derivation of these forces is the same as for the simplified free body diagram 220 of FIG. 14.

For embodiments where the dwell slopes β1 and β2 are reversed relative to the ramp slopes α1 and α2, the reactive force FR acting at the sloped interface between the dwell portions 336 and 346 generates a radially outward-acting radial component FRr of the reactive force FR. The outward acting radial component FRr places the latch plate 316 in tension, akin to the latch plate 74 of the simplified free body diagram 220 of FIG. 14. By placing the latch plate 316 in tension, the radially outward-acting radial component FRr caused by the dwell slopes β1 and β2 works to the same effect as the outwardly canted extended angle θ2 of FIG. 13, and with the same effect of further seating the cam follower 75 into the maximum radial end 194 of the cam slot 78, as described attendant to FIG. 15. Furthermore, by disposing the dwell portion 336 of the linear cam structure 312 in axial alignment with the seal member 60, the transferred axial force FTz on the interior panel reduces or eliminates distortion of the door 44 (e.g., bending and/or twisting of the panels of the door) that would otherwise occur if the transferred force FTz was not in axial alignment with the portion of the seal member 60. Accordingly, the disclosed modified sliding ramp deflectors of the latch mechanism 302 achieve the same motion and force vector advantages as the rocker linkage arrangement of the latching mechanism 70. Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative and preferred embodiments.

Various modifications to the embodiments may be apparent to one of skill in the art upon reading this disclosure. For example, persons of ordinary skill in the relevant arts will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can include fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can include a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A substrate container, comprising:
   a housing including a door frame that defines an opening about a central axis;
   a door configured to mount within the opening of the door frame and including an interior panel that cooperates with the housing when the door is mounted to the door frame to define an interior chamber of the substrate container, the interior panel defining a perimeter; and
   a latch mechanism housed within the door, including:
      a rotary cam rotatable about a cam axis;
      a latch plate including a cam follower and a latch tip, the cam follower being coupled to the rotary cam;
      a rocker linkage coupled to the latch plate proximate the latch tip, the rocker linkage including a first pivot coupled to the interior panel of the door and a second pivot coupled to the latch plate,
   the latch mechanism being extendible from a retracted configuration wherein the latch tip is radially inset from the door frame, to an extended configuration wherein the latch tip extends into the door frame, the rocker linkage rotating the latch tip in a first direction away from the interior panel that is parallel to the central axis and in a second direction that is radially outward from the cam axis to engage the latch tip with the door frame of the housing.

2. The substrate container of claim 1, wherein:
   the latch tip exerts an axial force on the door frame of the housing that is parallel to the central axis to seat the door within the door frame.

3. The substrate container of claim 2, wherein a force exerted on the rotary cam by the latch plate is less than 20% of the axial force exerted by the latch tip on the door frame of the housing.

4. The substrate container of claim 1, wherein the rocker linkage defines a rocker axis that passes through a center of the first pivot and a center of the second pivot, the rocker axis being within 10 degrees of perpendicular to the door panel when the latch mechanism is in the extended configuration.

5. The substrate container of claim 4, wherein the second pivot is canted toward an edge portion of the interior panel with respect to the first pivot when the latch mechanism is in the extended configuration, the edge portion being a closest of a plurality of edge portions at the perimeter of the interior panel.

6. The substrate container of claim 1, comprising a seal member disposed interstitially between the door and the door frame, wherein the first pivot is in substantial axial alignment with a portion of the seal member.

7. The substrate container of claim 1, wherein the central axis is substantially concentric with the cam axis.

8. The substrate container of claim 1, wherein the substrate container is a bottom opening pod.

9. The substrate container of claim 7, wherein the bottom opening pod is a reticle carrier.

10. The substrate container of claim 1, wherein said latch plate defines a V-shape.

\* \* \* \* \*